(12) United States Patent
Iizuka et al.

(10) Patent No.: US 11,049,646 B2
(45) Date of Patent: Jun. 29, 2021

(54) NOISE FILTER AND NOISE REDUCTION UNIT

(71) Applicants: Yazaki Corporation, Tokyo (JP); TOYOTA JIDOSHA KABUSHIKI KAISHA, Toyota (JP)

(72) Inventors: Hayato Iizuka, Kakegawa (JP); Kazuma Kayo, Kakegawa (JP); Hiroshi Aihara, Toyota (JP)

(73) Assignees: YAZAKI CORPORATION, Tokyo (JP); TOYOTA JIDOSHA KABUSHIKI KAISHA, Toyota (JP)

(*) Notice: Subject to any disclaimer, the term of this patent is extended or adjusted under 35 U.S.C. 154(b) by 139 days.

(21) Appl. No.: 16/021,373

(22) Filed: Jun. 28, 2018

(65) Prior Publication Data

US 2019/0006092 A1 Jan. 3, 2019

(30) Foreign Application Priority Data

Jun. 29, 2017 (JP) .............................. JP2017-127601

(51) Int. Cl.
*H01F 17/04* (2006.01)
*H01F 27/33* (2006.01)
(Continued)

(52) U.S. Cl.
CPC ......... *H01F 27/33* (2013.01); *B60R 16/0207* (2013.01); *H01F 17/04* (2013.01);
(Continued)

(58) Field of Classification Search
CPC ........ H01F 27/33; H01F 27/263; H01F 27/29; H01F 27/022; H01F 27/2852;
(Continued)

(56) References Cited

U.S. PATENT DOCUMENTS 1,841,685 A * 1/1932 Sola ........................ H01F 29/10
336/133
3,454,869 A * 7/1969 Strauss .............. H03K 17/9505
323/363
(Continued)

FOREIGN PATENT DOCUMENTS

CN 100390908 5/2008
CN 104980120 10/2015
(Continued)

OTHER PUBLICATIONS

Communication dated Jun. 11, 2019, from the Japanese Patent Office in counterpart application No. 2017-127601.
(Continued)

*Primary Examiner* — Mang Tin Bik Lian
(74) *Attorney, Agent, or Firm* — Sughrue Mion, PLLC

(57) ABSTRACT

A noise filter (10) is equipped with a plurality of conductors (20) having respective winding portions (21) and a ring-shaped core (30) which is inserted through the winding portions of the a plurality of conductors and made of a magnetic material. The ring-shaped core is composed of a pair of divisional cores (41) and (42) which are combined together by joining each pair of joining surfaces (43) and (44), located at each end, of the pair of divisional cores and. The one divisional core is straight and is inserted through the winding portions of the a plurality of conductors. The other divisional core has partition walls (45) each of which is located between adjacent ones of the a plurality of conductors, projects toward the one divisional core, and serves to form a magnetic path between the partition wall and the one divisional core.

8 Claims, 4 Drawing Sheets

(51) Int. Cl.
*H02P 29/50* (2016.01)
*H01F 27/26* (2006.01)
*H01F 27/29* (2006.01)
*H01F 27/02* (2006.01)
*H03H 7/42* (2006.01)
*H03H 1/00* (2006.01)
*B60R 16/02* (2006.01)
*H01F 27/28* (2006.01)

(52) U.S. Cl.
CPC ......... *H01F 27/022* (2013.01); *H01F 27/263* (2013.01); *H01F 27/2852* (2013.01); *H01F 27/29* (2013.01); *H02P 29/50* (2016.02); *H03H 1/00* (2013.01); *H03H 7/427* (2013.01); *H03H 2001/005* (2013.01); *H03H 2001/0092* (2013.01)

(58) Field of Classification Search
CPC ..... H01F 27/2847; H02P 29/50; H03H 7/427; H03H 1/00; H03H 2001/005; H03H 2001/0092; B60R 16/0207
USPC ................. 336/212, 170, 178, 214, 90, 192
See application file for complete search history.

(56) References Cited

U.S. PATENT DOCUMENTS

| | | | | |
|---|---|---|---|---|
| 6,469,589 B2* | 10/2002 | Takeda | .................. | H01F 17/06 333/12 |
| 7,352,269 B2* | 4/2008 | Li | ........................ | H01F 17/04 336/170 |
| 7,567,163 B2* | 7/2009 | Dadafshar | ........... | H01F 27/2847 336/178 |
| 7,847,662 B2* | 12/2010 | Saito | ..................... | H01F 17/041 29/602.1 |
| 8,125,305 B2* | 2/2012 | Saito | ....................... | H01F 17/06 29/602.1 |
| 8,350,658 B1* | 1/2013 | Stratakos | ................ | H01F 17/06 336/212 |
| 2006/0280921 A1* | 12/2006 | Oh | ............................ | H01F 3/14 428/212 |
| 2007/0080755 A1* | 4/2007 | Gilliland | .................. | H04B 3/28 333/12 |
| 2007/0176726 A1* | 8/2007 | Xu | ....................... | H02M 3/1584 336/229 |
| 2007/0252669 A1* | 11/2007 | Hansen | ................... | H01F 17/06 336/212 |
| 2015/0200051 A1* | 7/2015 | Umetani | .................. | H01F 3/12 336/178 |
| 2015/0294783 A1* | 10/2015 | Furukawa | ................ | H03H 7/09 174/72 A |
| 2017/0174152 A1 | 6/2017 | Yamaguchi et al. | | |
| 2018/0053591 A1 | 2/2018 | Haruna et al. | | |

FOREIGN PATENT DOCUMENTS

| | | |
|---|---|---|
| DE | 10-2006-005243 A1 | 8/2006 |
| DE | 10-2016-224798 A1 | 6/2017 |
| JP | 10-135044 A | 5/1998 |
| JP | 2009-10207 A | 1/2009 |
| JP | 2009135271 A | 6/2009 |
| JP | 2009206178 A | 9/2009 |
| JP | 2011-119477 A | 6/2011 |
| JP | 2017-112064 A | 6/2017 |
| WO | 2014092169 A1 | 6/2014 |
| WO | 2016143149 A1 | 9/2016 |

OTHER PUBLICATIONS

Communication dated Dec. 13, 2018, from the European Patent Office in counterpart European Application No. 18180738.9.

* cited by examiner

NOISE FILTER AND NOISE REDUCTION UNIT

CROSS-REFERENCES TO RELATED APPLICATION(S)

This application is based on and claims priority from Japanese Patent Application No. 2017-127601 filed on Jun. 29, 2017, and the entire contents of which are incorporated herein by reference.

BACKGROUND

The present invention relates to a noise filter and a noise reduction unit.

Among conventional noise filters for reducing noise such as a surge current flowing through an electric wire has been used to reduce both of normal-mode noise that reciprocates between lines and common-mode noise that travels between a line and a ground.

As for details of the above mounting structure, refer to JP 2009-206178 A and JP 2009-135271 A.

SUMMARY

Incidentally, the noise filter disclosed in Patent document 1 requires cumbersome assembling work of winding a coil around a bobbin, inserting a pair of E-shaped cores into the bobbin from opposite directions, and joining them to each other. It is therefore desired that this noise filter be increased in the efficiency of assembling work. In the noise filter disclosed in Patent document 2 in which lead wires are inserted through a rectangular core, it is difficult to attach lead wires in a later step. And increase in the noise reducing effect is desired.

An object of the invention is therefore to provide a noise filter that can reduce both of common-mode noise and normal-mode noise satisfactorily and is superior in the efficiency of assembling work as well as a noise reduction unit that is equipped with such a noise filter.

Embodiments of the present invention provide the following items (1) to (4).

(1) A noise filter comprising:
  a plurality of conductors each having a winding portion; and
  a ring-shaped core made from a magnetic material and being inserted through the winding portion,
  the ring-shaped core including a pair of divisional cores combined together by connecting each pair of joining surfaces located at each end of the pair of the divisional cores,
  one of the divisional cores having a straight shape and being inserted through the winding portion of each of the plurality of the conductors to arrange the plurality of the conductors in a row,
  the other of the divisional core having a partition wall located between adjacent conductors of the plurality of the conductors, the partition wall projecting toward the one divisional core to form a magnetic path between the one of the divisional core and the other of the divisional core,
  the ring-shaped core being configured to form a common-mode magnetic path surrounding all of the plurality of the conductors and a normal-mode magnetic path passing through the partition wall and surrounding each of the plurality of the conductors.

(2) The noise filter according to item (1), wherein
  a gap is formed between the partition wall and the one of the divisional core.

(3) The noise filter according to item (2), wherein a magnetic flux adjusting member containing a magnetic material is provided in the gap.

(4) A noise reduction unit comprising:
  the noise filter according to any one of item (1) to item (3);
  a housing holding the noise filter; and
  an electric wire of a wire harness introduced into the housing and electrically connected to at least one of the plurality of conductors of the noise filter.

According to first aspect of the invention, relating to the item (1), the common-mode magnetic path which surrounds the end portions of the winding portions of all of the conductors and the normal-mode magnetic paths each of which surrounds the end portions of the winding portion of the associated conductor are formed in the ring-shaped core. Thus, the noise filter 10 can suppress both of common-mode noise and normal-mode noise when currents flow through the conductors.

Furthermore, the divisional cores are combined together after the straight divisional core is inserted through the winding portions of the plural conductors. In this manner, the plural conductors can be attached to the ring-shaped core easily, which means increase in the efficiency of assembling work. Still further, since the conductors are arranged in a row along the straight divisional core, the noise filter can be made low in height and hence installed in a narrow space. In addition, the conductors can be positioned and set at the prescribed positions by means of the partition walls of the other divisional core.

According to second aspect of the invention, relating to the item (2), the magnetic flux of each normal-mode magnetic path can be adjusted properly by adjusting the length of the gap between the one divisional core and each partition wall.

According to third aspect of the invention, relating to the item (3), the magnetic flux of each normal-mode magnetic path can be adjusted more properly by adjusting the content of the magnetic material in the magnetic flux adjusting member which is provided in the gap between the one divisional core and each partition wall.

According to fourth aspect of the invention, relating to the item (4), when it is inserted between, for example, wires, extending from an inverter and a motor, of a wire harness, noise that is generated by high-speed switching in the inverter can be reduced satisfactorily. In particular, both of normal-mode noise that reciprocates between lines and common-mode noise that travels between a line and a ground can be reduced properly.

Furthermore, since the noise filter which is low in height is housed in the housing, the noise reduction unit is reduced in height and hence can be installed in a narrow space. For example, the noise reduction unit which is connected to a wire harness of a vehicle or the like at its halfway position can be fixed to a floor panel of the vehicle. Still further, the noise filter having the ring-shaped core 30 made of a magnetic material can be protected by the housing.

According to the invention, it is possible to provide a noise filter that can reduce both of common-mode noise and normal-mode noise satisfactorily and is superior in the efficiency of assembling work as well as a noise reduction unit that is equipped with such a noise filter.

The invention has been described above concisely. The details of the invention will become more apparent when the modes for carrying out the invention (hereinafter referred to as an embodiment) described below are read through with reference to the accompanying drawings.

DETAILED DESCRIPTION

Embodiment

Figure 1:
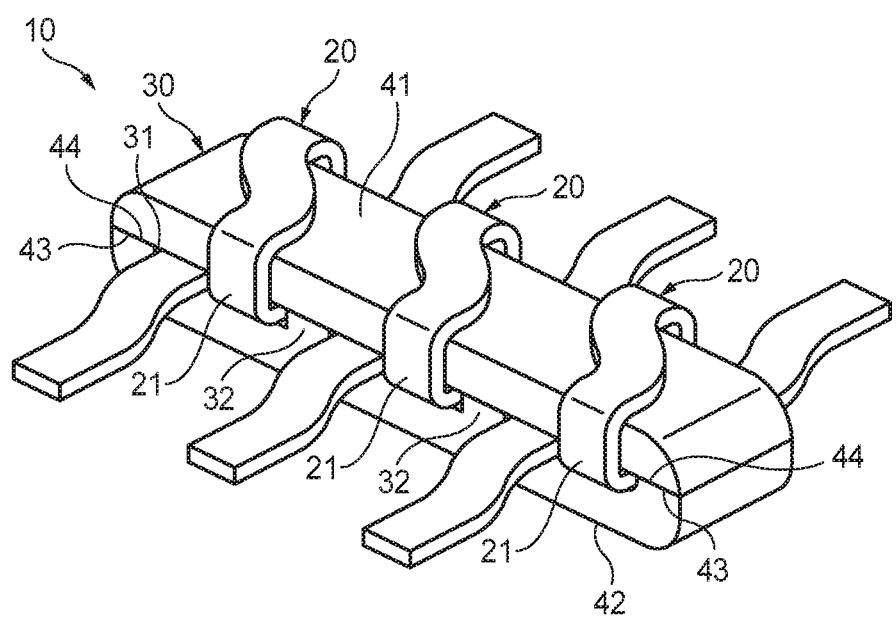
FIG. 1 is a perspective view of a noise filter according to an embodiment of the present invention.
Figure 2:
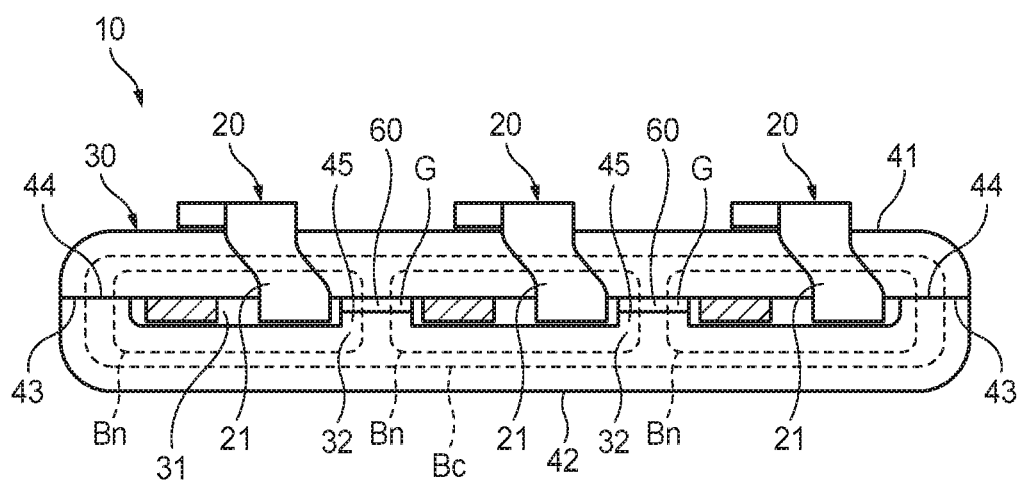
FIG. 2 is a side view of the noise filter according to the embodiment.

An embodiment of the present invention will be hereinafter described with reference to the drawings. FIG. 1 is a perspective view of a noise filter 10 according to the embodiment. FIG. 2 is a side view of the noise filter 10 according to the embodiment.

As shown in FIGS. 1 and 2, the noise filter 10 has plural (in this example, three) conductors 20 and a ring-shaped core 30. For example, the noise filter 10 is provided for a wire harness that connects an inverter and a motor of an electric vehicle, a hybrid car, or the like. The inverter converts a DC voltage of a power source such as a battery into an AC voltage and thereby drives the motor for rotating wheels. Since the inverter converts a DC voltage into an AC voltage by high-speed switching, a high-frequency surge current generated by the switching may flow through wires of the wire harness. Provided in the wire harness that connects the inverter and the motor, the noise filter 10 reduces noise generated by the switching.

Originally, the conductors 20 are flat-plate-like busbars produced by, for example, punching a conductive metal plate into strips. A middle portion of each conductor 20 is made a ring-shaped winding portion 21 that is formed by, for example, bending so as to project upward. The winding portion 21 is inclined in a plan view, whereby end portions of the winding portion 21 are deviated (i.e., spaced) from each other in a plan view so as not to be in contact with each other.

For example, the ring-shaped core 30 is made of a magnetic material such as ferrite. The ring-shaped core 30 is shaped like a flat ring having an insertion passage 31 which is an elliptical hole. The insertion passage 31 of the ring-shaped core 30 is a little greater in height than the thickness of the conductors 20.

The ring-shaped core 30 is composed of a pair of divisional cores 41 and 42. The flat ring-shaped core 30 having the insertion passage 31 is formed by combining together the divisional cores 41 and 42 that are set vertically.

Each of the divisional cores 41 and 42 extends straightly. The plural conductors 20 are wound on the one divisional core 41 which is set on the top side, so as to be arranged in a row. Both end portions of the winding portion 21 of each conductor 20 that is wound on the divisional core 41 are inserted in the insertion passage 31.

Surface portions 43, located at the two respective ends in the longitudinal direction of the one divisional core 41 and facing the other divisional core 42, of the one divisional core 41 are joining surfaces 44. And two end portions, in its longitudinal direction, of the other divisional core 42 project toward the one divisional core 41 and end surfaces of the projected portions are joining surfaces 44. The divisional cores 41 and 42 are joined to each other by bringing each pair of joining surfaces 43 and 44 into contact with each other. Each pair of joining surfaces 43 and 44 are bonded to each other by an adhesive member that is in paste or sheet form and may contain a magnetic material such as a ferrite powder.

In this manner, a ring-shaped common-mode magnetic path Bc which surrounds the end portions of the winding portions 21 of all of the conductors 20 that are inserted through the insertion passage 31 is formed in the ring-shaped core 30 by the divisional cores 41 and 42 that are bonded to each other.

The ring-shaped core 30 has plural magnetic path forming portions 32 which are disposed between the conductors 20 attached to the one divisional core 41. Each magnetic path forming portion 32 has a partition wall 45 which projects from the other divisional core 42 toward the one divisional core 41. A gap G is formed between each partition wall 45 and the one divisional core 41, and a magnetic flux adjusting member 60 is provided in the gap G. Magnetic paths each of which passes through a magnetic path forming portion(s) 32 are formed in the ring-shaped core 30. In this manner, plural ring-shaped normal-mode magnetic paths Bn each of which surrounds the end portions of the winding portion 21 of the associated conductor 20 are formed in the ring-shaped core 30.

For example, each magnetic flux adjusting member 60 is in paste or sheet form and contains a magnetic material such as a ferrite powder. The magnetic flux of each normal-mode magnetic path Bn is adjusted by adjusting the content of the magnetic material.

Figure 3:
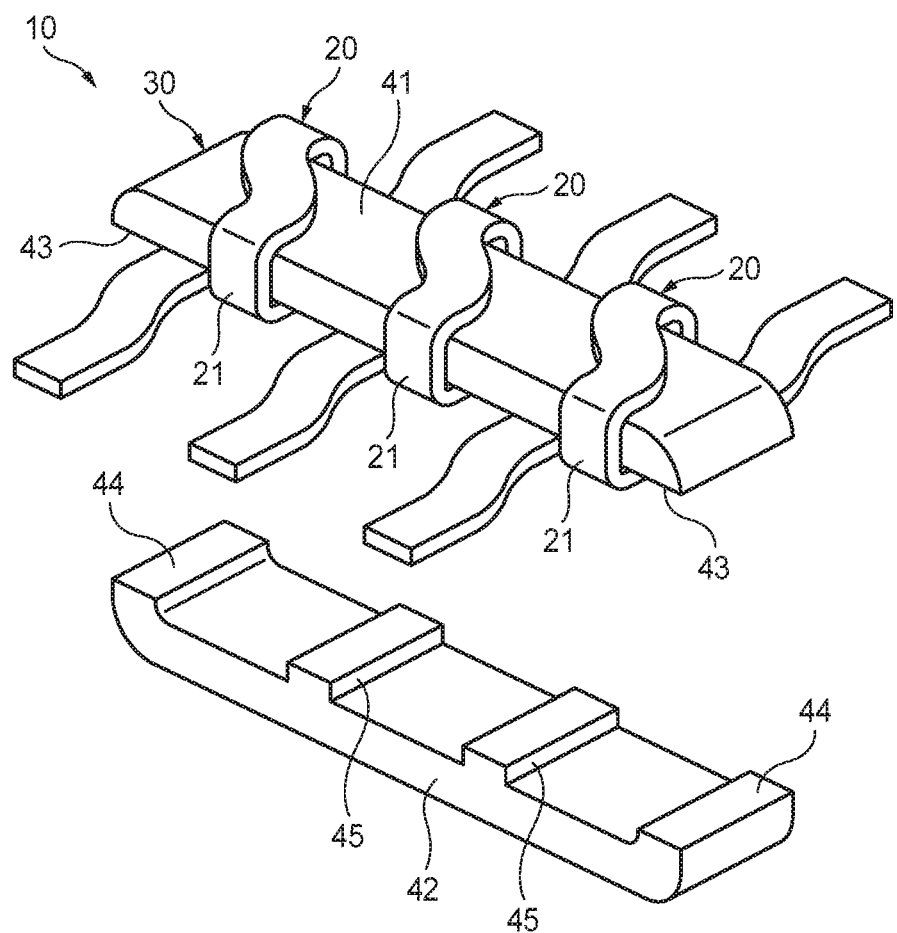
FIG. 3 is an exploded perspective view of the noise filter according to the embodiment.

How to assemble the noise filter 10 which is configured as described above will be described below. FIG. 3 is an exploded perspective view of the noise filter 10 according to the embodiment.

To assemble the noise filter 10, first, plural conductors 20 having respective winding portions 21 are prepared.

Then, as shown in FIG. 3, the plural conductors 20 are attached to the one divisional core 41 of a ring-shaped core 30. More specifically, the divisional core 41 is inserted into the winding portions 21 of the conductors 20 that are oriented so that the projection portions of the winding portions 21 are located on the top side. As a result, the conductors 20 are wound on the one divisional core 41 so as to be arranged in a row.

Subsequently, each pair of joining surfaces 43 and 44 of the divisional cores 41 and 42 are brought into contact with each other in a state that a magnetic flux adjusting member 60 is stuck to the end surfaces of the partition walls 45 of the other divisional core 42, and each pair of joining surfaces 43 and 44 are bonded (joined) to each other with an adhesive member that may contain a magnetic material.

In this manner, a noise filter 10 is formed in which the plural conductors 20 are attached to the ring-shaped core 30 which is composed of the pair of divisional cores 41 and 42. And a magnetic path forming portion 32 is formed in which a magnetic flux adjusting member 60 exists in the gap G between each partition wall 45 and the divisional core 41.

In the thus-produced noise filter 10, a ring-shaped common-mode magnetic path Bc which surrounds the end portions of the winding portions 21 of all of the conductors 20 is formed in the ring-shaped core 30 which is composed of the divisional cores 41 and 42 bonded to each other. Furthermore, plural ring-shaped normal-mode magnetic paths Bn are formed each of which passes through one or ones of the magnetic path forming portions 32 and surrounds the end portions of the winding portion 21 of the associated conductor 20.

In this noise filter 10, when currents flow through the conductors 20, common-mode noise is suppressed by the common-mode magnetic path Bc and normal-mode noise is suppressed by each normal-mode magnetic path Bn.

In the noise filter 10 according to the embodiment, as described above, the common-mode magnetic path Bc which surrounds the end portions of the winding portions 21 of all of the conductors 20 and the normal-mode magnetic paths Bn each of which surrounds the end portions of the winding portion 21 of the associated conductor 20 are formed in the ring-shaped core 30. Thus, the noise filter 10 can suppress both of common-mode noise and normal-mode noise when currents flow through the conductors 20.

Furthermore, the divisional cores 41 and 42 are combined together after the straight divisional core 41 is inserted through the winding portions 21 of the plural conductors 20. In this manner, the plural conductors 20 can be attached to the ring-shaped core 30 easily, which means increase in the efficiency of assembling work. Still further, since the conductors 20 are arranged in a row along the straight divisional core 41, the noise filter 10 can be made low in height and hence installed in a narrow space. In addition, the conductors 20 can be positioned and set at the prescribed positions by means of the partition walls 45 of the other divisional core 42.

The magnetic flux of each normal-mode magnetic path Bn can be adjusted properly by adjusting the length of the gap G between the one divisional core 41 and each partition wall 45 of the other divisional core 42. In addition, the magnetic flux of each normal-mode magnetic path Bn can be adjusted more properly by adjusting the content of the magnetic material in the magnetic flux adjusting member 60 which is provided in each gap G.

The magnetic flux adjusting member 60 need not always be provided in the gap G between the one divisional core 41 and each partition wall 45 of the other divisional core 42. Without the magnetic flux adjusting member 60, the magnetic flux of each normal-mode magnetic path Bn can be adjusted properly by managing the length of each gap G.

Although in the above embodiment the conductors 20 of the noise filter 10 are busbars, the conductors 20 may be, for example, insulated electric wires in each of which a core wire is covered with an outer sheath.

It suffices that at least the one divisional core 41, inserted through the winding portions 21 of the conductors 20, of the ring-shaped core 30 be straight; the other divisional core 42 need not always be straight and may be curved, for example.

Figure 4:
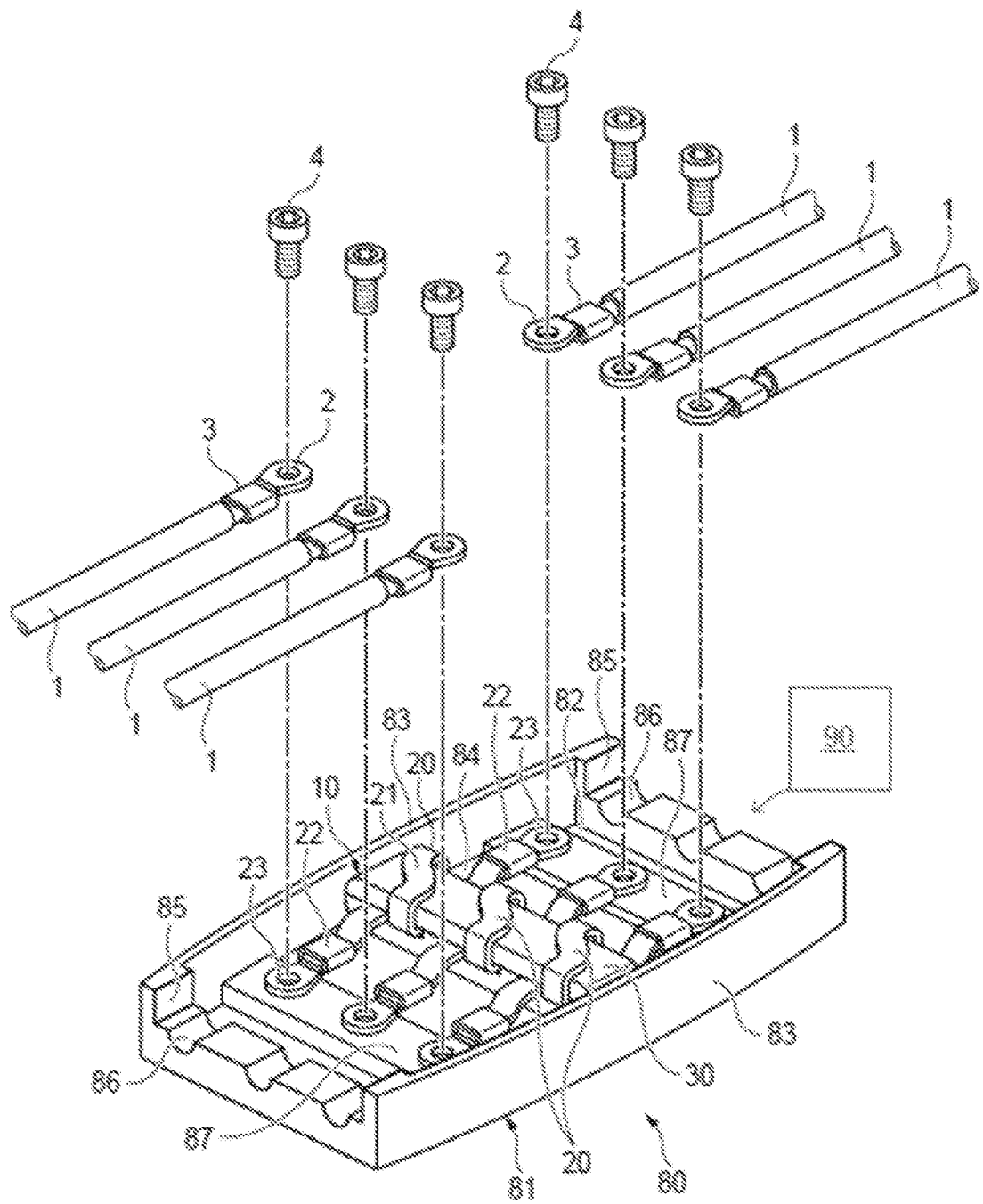
FIG. 4 is a perspective view of a noise reduction unit that is equipped with the noise filter according to the embodiment.

Next, a noise reduction unit 80 which is equipped with the above-described noise filter 10 will be described. FIG. 4 is a perspective view of the noise reduction unit 80 which is equipped with the noise filter 10. As shown in FIG. 4, the noise reduction unit 80 is equipped with a housing 81 which houses the noise filter 10.

The housing 81 is made of an insulative synthetic resin and has a bottom plate 82 and side walls 83 which are erected from the bottom plate 82 at its two respective sides. The housing 81 is shaped like a rectangular box having a housing space that is open at the top. A central portion of the bottom plate 82 is a core holding portion 84 which defines a central portion of the housing space in which to set the noise filter 10. Terminals 22 are fixed to two respective end portions of each conductor 20 of the noise filter 10 which is housed in the housing 81. Each terminal 22 has a bolt insertion hole 23 and is fixed to the associated conductor 20 by, for example, crimping and thereby connected to it electrically.

The housing 81 has wire introduction portions 85 at the two respective ends in the longitudinal direction, and wires 1 of a wire harness are introduced from the wire introduction portions 85. Each wire introduction portion 85 is formed with U-shaped wire holding grooves 86. The bottom plate 82 is formed with terminal stages 87 between the core holding portion 84 and the wire introduction portions 85. Insert nuts (not shown) are buried in the terminal stages 87 by insert molding, for example. The terminals 22 which are fixed to the conductors 20 of the noise filter 10 are placed on top of the terminal stages 87, more specifically, over the respective insert nuts.

The wires 1, extending from an inverter and a motor, of the wire harness are connected to the above-configured noise reduction unit 80. A terminal 3 having a bolt insertion hole 2 at one end is connected to each wire 1. Each wire 1 is introduced through a wire introduction portion 85 of the housing 81 and is set and held in a wire holding groove 86. The terminal 3 of each wire 1 is placed on the terminal 22 of the corresponding conductor 20 that is placed on top of the associated terminal stage 87, whereby the bolt insertion holes 2 and 23 communicate with each other. A bolt 4 is inserted into these bolt insertion holes 2 and 23 and screwed into the associated insert nut of the terminal stage 87, whereby the terminal 3 of the wire 1 and the terminal 22 of the conductor 20 are fastened to the terminal stage 87 and electrically connected to each other. In this manner, the wires 1, extending from the inverter and the motor, of the wire harness are connected to the noise reduction unit 80 and noise generated by high-speed switching in the inverter can be reduced by the noise filter 10 of the noise reduction unit 80.

According to the above-described noise reduction unit 80 having the noise filter 10, when it is inserted between, for example, wires 1, extending from an inverter and a motor, of a wire harness, noise that is generated by high-speed switching in the inverter can be reduced satisfactorily. In particular, both of normal-mode noise that reciprocates between lines and common-mode noise that travels between a line and a ground can be reduced properly.

Furthermore, since the noise filter 10 which is low in height is housed in the housing 81, the noise reduction unit 80 is reduced in height and hence can be installed in a narrow space. For example, the noise reduction unit 80 which is connected to a wire harness of a vehicle or the like at its halfway position can be fixed to a floor panel of the vehicle. Still further, the noise filter 10 having the ring-shaped core 30 made of a magnetic material can be protected by the housing 81.

A sealing material 90 which is a synthetic resin such as an epoxy resin is charged into the housing 81 of the noise reduction unit 80. By charging the sealing material 90 into the housing 81 in this manner, the noise filter 10 having the ring-shaped core 30 made of a magnetic material can be fixed and protected reliably and can be increased in impact resistance. And the noise reduction unit 80 can be miniaturized because it no longer requires a complex waterproof structure. The waterproofness of the noise reduction unit 80 can be made even so high that it can be installed outside the vehicle body by putting a lid on top of the housing 81.

OTHER EMBODIMENTS

The invention is not limited to the above embodiment and various modifications, improvements, etc. can be made as appropriate. The materials, shapes, sets of dimensions, numbers, locations, etc. of the respective constituent elements of the above embodiment are not limited to those disclosed but can be determined in desired manners as long as the invention can be implemented.

Features of the above-described noise filter 10 according to the embodiment of the invention will be summarized below concisely as items (1) to (5):

(1) A noise filter (10) comprising:
a plurality of conductors (20) each having a winding portion (21); and
a ring-shaped core (30) made from a magnetic material and being inserted through the winding portion (21),
the ring-shaped core (30) including a pair of divisional cores (41, 42) combined together by connecting each pair of joining surfaces (43, 44) located at each end of the pair of the divisional cores (41, 42),
one of the divisional cores (41, 42) having a straight shape and being inserted through the winding portion (21) of each of the plurality of the conductors (20) to arrange the plurality of the conductors (20) in a row,
the other of the divisional core having a partition wall (45) located between adjacent conductors of the plurality of the conductors (20), the partition wall (45) projecting toward the one divisional core to form a magnetic path between the one of the divisional core and the other of the divisional core,
the ring-shaped core (30) being configured to form a common-mode magnetic path (Bc) surrounding all of the plurality of the conductors (20) and a normal-mode magnetic path (Bn) passing through the partition wall (45) and surrounding each of the plurality of the conductors (20).

(2) The noise filter (10) according to item (1), wherein
a gap (G) is formed between the partition wall (45) and the one of the divisional core.

(3) The noise filter (10) according to item (2), wherein
a magnetic flux adjusting member (60) containing a magnetic material is provided in the gap.

(4) A noise reduction unit comprising:
the noise filter (10) according to any one of item (1) to item (3);
a housing holding the noise filter; and
an electric wire of a wire harness introduced into the housing and electrically connected to at least one of the plurality of conductors (20) of the noise filter.

(5) The noise reduction unit according to item (4), wherein
a sealing material is charged in the housing.

DETAILED DESCRIPTION

1: Wire
10: Noise filter
20: Conductor
21: Winding portion
30: Ring-shaped core
41, 42: Divisional core
43, 44: Joining surface
45: Partition wall
60: Magnetic flux adjusting member
80: Noise reduction unit
81: Housing
Bc: Common-mode magnetic path
Bn: Normal-mode magnetic path
G: Gap

The invention claimed is:

1. A noise filter comprising:
a plurality of flat plate-shaped conductors each having a winding portion; and
a ring-shaped core made from a magnetic material, the ring-shaped core inserted through the winding portion of each of the plurality of flat plate-shaped conductors, wherein
the ring-shaped core including a pair of divisional cores combined together by connecting each pair of joining surfaces located at each end of the pair of the divisional cores,
one of the divisional cores having a straight shape and being inserted through the winding portion of each of the plurality of the flat plate-shaped conductors to arrange the plurality of the flat plate-shaped conductors in a row,
the other of the divisional cores having a partition wall located between adjacent conductors of the plurality of the flat plate-shaped conductors, the partition wall projecting toward the one divisional core to form a magnetic path between the one of the divisional core and the other of the divisional core,
the winding portion being inclined with respect to the one of the divisional cores in a plan view,
end portions of the winding portion, that are opposite to each other, being separated from each other in the plan view,
the ring-shaped core being configured to form a common-mode magnetic path surrounding all of the plurality of the flat plate-shaped conductors and a normal-mode magnetic path passing through the partition wall and surrounding one of the plurality of the flat plate-shaped conductors, and
the partition wall is location between, in a first direction, the adjacent conductors of the plurality of flat plate-shaped conductors, and the partition wall projects in a second direction, toward the one divisional core,
a first end portion and a second end portion, from among the end portions of the winding portion that is wound around the one of the divisional cores, are provided between the pair of divisional cores in a same plane that is perpendicular to the second direction.

2. The noise filter according to claim 1, wherein
a gap is formed between the partition wall and the one of the divisional cores.

3. The noise filter according to claim 2, wherein
a magnetic flux adjusting member containing a magnetic material is provided in the gap.

4. A noise reduction unit comprising:
the noise filter according to claim 1;
a housing holding the noise filter; and
an electric wire of a wire harness introduced into the housing and electrically connected to at least one of the plurality of flat plate-shaped conductors of the noise filter.

5. The noise reduction unit according to claim 4, wherein
a sealing material is disposed in the housing.

6. The noise filter according to claim 1, wherein
each of the plurality of flat plate-shaped conductors are wound around the ring-shaped core only a single time.

7. The noise filter according to claim 1, wherein
the first end portion and the second end portion are spaced apart from each other in the first direction.

8. The noise filter according to claim 7, wherein
the first end portion and the second end portion are inclined toward each other in the first direction.

* * * * *